(12) United States Patent
Burd et al.

(10) Patent No.: US 7,072,417 B1
(45) Date of Patent: Jul. 4, 2006

(54) LDPC ENCODER AND METHOD THEREOF

(75) Inventors: Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 911 days.

(21) Appl. No.: 09/730,752

(22) Filed: Dec. 7, 2000

Related U.S. Application Data

(60) Provisional application No. 60/214,781, filed on Jun. 28, 2000.

(51) Int. Cl.
*H04L 27/12* (2006.01)
*H04L 27/06* (2006.01)
*G06F 11/00* (2006.01)

(52) U.S. Cl. .................. 375/295; 375/316; 714/800; 714/801

(58) Field of Classification Search .......... 375/242, 375/246, 253, 295, 316; 714/6, 800, 801
See application file for complete search history.

(56) References Cited

U.S. PATENT DOCUMENTS

| | | | | |
|---|---|---|---|---|
| 4,295,218 A | | 10/1981 | Tanner .................. 371/40 |
| 4,601,044 A | * | 7/1986 | Kromer et al. .......... 375/286 |
| 5,537,444 A | | 7/1996 | Nill et al. ............... 375/341 |
| 5,757,821 A | | 5/1998 | Jamal et al. ............ 371/30 |
| 5,926,232 A | | 7/1999 | Mangold et al. ........ 348/845.1 |
| 5,930,272 A | * | 7/1999 | Thesling ................. 714/752 |
| 5,933,462 A | | 8/1999 | Viterbi et al. .......... 375/341 |
| 5,974,540 A | | 10/1999 | Morikawa et al. |
| 5,983,385 A | | 11/1999 | Khayrallah et al. |
| 6,002,716 A | | 12/1999 | Meyer et al. ........... 375/231 |
| 6,009,549 A | | 12/1999 | Bliss et al. ............ 714/769 |
| 6,021,518 A | | 2/2000 | Pelz ....................... 714/799 |
| 6,023,783 A | | 2/2000 | Divsalar et al. |
| 6,028,728 A | | 2/2000 | Reed ....................... 360/51 |
| 6,081,918 A | | 6/2000 | Spielman ................. 714/746 |
| 6,145,114 A | | 11/2000 | Crozier et al. |
| 6,145,144 A | | 11/2000 | Poehlmann et al. |
| 6,161,209 A | | 12/2000 | Moher |
| 6,182,261 B1 | | 1/2001 | Haller et al. |
| 6,219,817 B1 | * | 4/2001 | Holman ................... 714/758 |
| 6,438,180 B1 | | 8/2002 | Kavcic et al. |
| 6,539,367 B1 | | 3/2003 | Blanksby et al. |
| 6,715,121 B1 | * | 3/2004 | Laurent ................... 714/758 |

FOREIGN PATENT DOCUMENTS

| | | |
|---|---|---|
| JP | 2004164767 | 10/2004 |
| WO | WO 96/37050 | 11/1996 |
| WO | WO 00/19616 A2 | 4/2000 |

OTHER PUBLICATIONS

L.H.C. Lee, Computation of the Right–Inverse of G(D) and the Left–Inverse of H'(D), Jun. 21, 1990, IEEE vol. 26 No. 13, p. 904–906.*
U.S. Appl. No. 09/559,186, filed Apr. 27, 2000, Nazari et al.
U.S. Appl. No. 09/730,597, filed Dec. 7, 2000, Burd et al.
U.S. Appl. No. 09/730,603, filed Dec. 7, 2000, Wu et al.
U.S. Appl. No. 09/730,598, filed Dec. 7, 2000, Burd et al.
U.S. Appl. No. 09/901,507, filed Jul. 9, 2001, Wu et al.

(Continued)

*Primary Examiner*—Temesghen Ghebretinsae
*Assistant Examiner*—Sam K. Ahn

(57) ABSTRACT

The present invention directed to a method and apparatus to perform low-density parity-check code encoding of user data u of length $N_u$, by inserting parity data p of length $N_p$ into output data c of length N in accordance with a parity matrix H such that $H \cdot c = 0$, comprising the steps of: (a) receiving the user data of block length $N_u$; (b) decomposing $H \cdot c$ into a first component $H_u \cdot u$ corresponding to the user data and a second component $H_p \cdot p$ corresponding to the parity data such that $H_u \cdot u + H_p \cdot p = 0$; (c) calculating a vector $u = H_u \cdot u$; and (d) calculating $p = H_p^{-1} \cdot u$.

42 Claims, 5 Drawing Sheets

OTHER PUBLICATIONS

"An Intuitive Justification and a Simplified Implementation of the MAP Decoder for Convolutional Codes", IEEE Journal On Selected Areas In Communications, vol. 16, No. 2, Feb. 1995, Andrew J. Viterbi.

"Good Error–Correcting Codes Based On Very Sparse Matrices", IEEE Transactions On Information Theory, vol. 45, No. 2, Mar. 1999, David J.C. MacKay.

"Low–Density Parity–Check Codes", Robert G. Gallager 1963.

"Coding And Iterative Detection For Magnetic Recording Channels", The Kluwer International Series In Engineering And Computer Science, Zining Wu.

Coding, Iterative Detection And Timing Recovery For Magnetic Recording Channels, A Dissertation, Zining Wu.

Shoemake and Heegard, "Computationally Efficient Turbo Decoding with Bi–DIrectional Viterbi Algorithm (BIVA)", IEEE, ISIT 1997.

* cited by examiner

LDPC ENCODER AND METHOD THEREOF

CROSS REFERENCE TO RELATED APPLICATIONS

The present invention claims priority under 35 U.S.C. §119 (e) from U.S. provisional application Ser. No. 60/214,781, entitled "Address Generator for LDPC Encoder and Decoder and Method Thereof," filed Jun. 28, 2000, the contents of which are incorporated herein by reference.

The present invention is related to the following commonly-assigned, copending applications:

"Multi-Mode Iterative Detector", filed on Apr. 27, 2000 and assigned application Ser. No. 09/559,186, the contents of which are incorporated herein by reference, "Address Generator for LDPC Encoder and Decoder and Method Thereof", filed on even date and assigned application Ser. No. 09/730,597, the contents of which are incorporated herein by reference, "LDPC Decoder and Method Thereof", filed on even date and assigned application Ser. No. 09/730,603, the contents of which are incorporated herein by reference, and "Parity Check Matrix and Method of Forming Thereof", filed on even date and assigned application Ser. No. 09/730,598, the contents of which are incorporated herein by reference.

BACKGROUND OF THE INVENTION

1. Field of the Invention

The present invention relates generally to a linear block encoder in a data transmission system. More particularly, the present invention relates a low-density parity-check code (LDPC) encoder for a write channel in a channel.

2. Description of the Related Art

FIG. 1 illustrates a conventional digital data transmission system. As shown therein, a digital data transmission system comprises a transmitting section 300 for transmitting user data to receiver 500 via communication channel 401.

The operation of transmission section 300 will now be explained. Prior to processing by transmitting section 300, input or user data maybe encoded with an error correcting code, such as the Reed/Solomon code, or run length limited encoded (RLL) or a combination thereof by encoder 302. The encoded output encoder 302 is then interleaved by deinterleaver 308 for input to linear block code encoder 304 which generates parity data in a known manner utilizing linear block codes. One example of a linear block code is a low-density parity-check code (LDPC) which is discussed by Robert G. Gallager in *Low-Density Parity-Check Codes*, 1963, M.I.T. Press and by Zining Wu in *Coding and Iterative Detection For Magnetic Recording Channels*, 2000, Kluwer Academic Publishers, the contents of each of which are incorporated in their entirety by reference. Deinterleaver 308 permutes the data so that the same data is reordered before encoding by linear block code encoder 304. By permuting or redistributing the data, deinterleaver 308 attempts to reduce the number of nearest neighbors of small distance error events. User data at the output of encoder 302 is referred to as being in the channel domain; that is the order in which data is transmitted through the channel. The order of data processed by deinterleaver 308 is referred to as being in the linear block code domain. The parity data from linear block code encoder 304 is combined with the data encoded by encoder 302 by multiplexer 306 for input to channel transmitter 310.

Transmitter 310 transmits the combined user and parity data from multiplexer 306 typically as an analog signal over communication channel 401 in the channel domain. Communication channel 401 may include any wireless, wire, optical and the like communication medium. Receiver 500 comprises a front-end circuit 502 comprising analog to digital and equalization circuits. The digital signal front-end circuit 502 is input to soft channel decoder 504, which provides probability information of the detected data. Soft channel decoder 504 may be implemented by a Soft Viterbi Detector or the like. The output of the soft channel decoder 504, which is in the channel domain, is converted into the linear block code domain by deinterleaver 510. Deinterleaver 510 is constructed similarly to deinterleaver 308. Soft linear block code decoder 506 utilizes this information and the parity bits to decode the received data. One output of soft linear block code decoder 506 is fed back to soft channel decoder 504 via interleaver 512, which converts data in the linear block code domain to the channel domain. Interleaver 512 is constructed to perform the reverse operations of deinterleaver 510. Soft channel decoder 504 and soft linear block code decoder 506 operate in an iterative manner to decode the detected data.

The other output of soft linear block code decoder 506 is converted from the linear block domain to the channel domain by interleaver 514. Interleaver 514 is constructed similarly to interleaver 512. The output of interleaver 514 is passed on for further processing to decoder 508. Decoder 508 is implemented to perform the reverse operations of encoder 302.

FIG. 2 is a block diagram of a data transmission system implementing an address generator in lieu of the interleave/deinterleaver. A more detailed description of this system can be found in commonly assigned copending application "Address Generator for LDPC Encoder and Decoder and Method Thereof" filed on even date and assigned application Ser. No. 09/730,597, the contents of which are incorporated herein by reference. In general as shown therein, a digital data transmission system comprises a transmitting section 300' for transmitting user data to receiver 500' via communication channel 401. The inventors have observed that a linear block code encoder is not dependent on a position of a bit interleaved. Rather the linear block code encoder only requires a list of equations for a given bit. In other words, there is no need to process the data in the order defined by the interleaver, instead data may be processed in the same order as it is written to the channel. This can be accomplished by incorporating an address generator to provide an address of the appropriate equation of the linear block code encoder. This principle can be similarly applied to the soft linear block decoder. As a result, deinterleaver 308 of the conventional system is now replaced by address generator 328, and deinterleaver 510 is now replaced by address generator 530. Accordingly, there is no requirement for the physical interleaving of data in the receiver 500', since the data remains in the same order as the order of bits of data in the channel throughout this system. The order of bits of data transmitted through the channel is referred to as the channel domain.

A Low-Density Parity-Check Code (LDPC) of block length N (codeword size) has a parity check matrix H of size $N_p \times N$ and is of full rank (except for two extra rows), and $N_p \ll N$. The code space of this code consists of all codewords satisfying:

$$\{c \in \{0,1\}^N / Hc = 0\} \qquad (1),$$

where c is a N×1 vector.

LDPC encoder 304 takes a column of user bits, u, having a length of $N_u = N - N_p$ and inserts $N_p$ parity bits to form codeword c to satisfy equation 1. A parity vector p is combined with u in multiplexer 306 to form codeword c.

The parity vector p is generated by multiplying u by a parity generating matrix P having a size of $N_u \times N_p$.

$$p = Pu \quad (2)$$

For example for $N_p=220$ and $N\sim 5{,}000$, H can be chose to have a nice geometric structure. However, the corresponding parity generating matrix P is very irregular which in hardware would require storing all N user bits in flip-flop registers to perform matrix multiplication by P. and LDPC encoder would require additional area on the integrated circuit. It is estimated that such an LDPC encoder would require approximately 0.66 mm².

SUMMARY OF THE INVENTION

According to a first aspect of the present invention a method is provided to perform low-density parity-check code encoding of user data u of length $N_u$, by inserting parity data p of length $N_p$ into output data c of length N in accordance with a parity matrix H such that $H \cdot c = 0$, comprising the steps of: (a) receiving the user data of block length $N_u$; (b) decomposing $H \cdot c$ into a first component $H_u \cdot u$ corresponding to the user data and a second component $H_p \cdot p$ corresponding to the parity data such that $H \cdot c = H_u \cdot u + H_p \cdot = 0$; (c) calculating a vector $\underline{u} = H_u \cdot u$; and (d) calculating $p = H_p^{-1} \cdot \underline{u}$.

According to a second aspect of the present invention, $H_u$ comprises a $N_p \times N_u$ matrix and $H_p$ comprises a $N_p \times N_p$ matrix.

According to a third aspect of the present invention the method further comprises the step of (e) receiving address information, and step (c) is performed in accordance with step(e).

According to a fourth aspect of the present invention step (c) comprises the step of updating elements of $\underline{u}$ as follows: $\underline{u}(i) = \underline{u}(i) \oplus$ bit.

According to a fifth aspect of the present invention step (d) comprises the step of (g) reducing a row weight of $H_u^{-1}$ by representing $H_u^{-1}$ as M1*M2.

According to a sixth aspect of the present invention step (d) comprises the step of (g) reducing a row weight of $H_u^{-1}$ by representing H as $$\prod_{i=1}^{s} M_i.$$

According to a seventh aspect of the present invention step (c) is performed prior to step (d).

According to an eighth aspect of the present invention, a low-density parity-check code encoder is provided to encode user data u of length $N_u$, by inserting parity data p of length $N_p$ into output data c of length N in accordance with a parity matrix H such that $H \cdot c = 0$. An input inputs the user data of block length $N_u$, an H c decomposer decomposes $H \cdot c$ into a first component $H_u \cdot u$ corresponding to the user data and a second component $H_p \cdot p$ corresponding to the parity data such that $H_u \cdot u + H_p \cdot p = 0$. A $\underline{u}$ calculator to calculate a vector $\underline{u} = H_u \cdot u$, and a $p = \underline{P} \underline{u}$ calculator to calculate $p = H_p^{-1} \cdot \underline{u}$.

According to a ninth aspect of the present invention, a second input is provided to input address information, and the $\underline{u}$ calculator calculates the vector $\underline{u} = H_u \cdot u$ in accordance with the second input.

According to a tenth aspect of the present invention, the $\underline{u}$ calculator updates elements of $\underline{u}$ as follows: $\underline{u}(i) = \underline{u}(i) \oplus$ bit.

According to an eleventh aspect of the present invention, the $p = \underline{P} \underline{u}$ calculator reduces a row weight of $H_u^{-1}$ by representing $H_u^{-1}$ as M1*M2.

According to a twelfth aspect of the present invention, the $p = \underline{P} \underline{u}$ calculator reduces a row weight of $H_u^{-1}$ representing $H_u^{-1}$ as $$\prod_{i=1}^{s} M_i.$$

According to a thirteenth aspect of the present invention, the $\underline{u}$ calculator calculates the vector $\underline{u} = H_u \cdot u$ prior to the $p = \underline{P} \underline{u}$ calculator calculating $p = H_p^{-1} \underline{u}$.

According to a fourteenth aspect of the present invention, a computer program is provided to perform low-density parity-check code encoding of user data u of length $N_u$, by inserting parity data p of length $N_p$ into output data c of length N in accordance with a parity matrix H such that $H \cdot c = 0$, comprising the steps of (a) receiving the user data of block length $N_u$; (b) decomposing $H \cdot c$ into a first component $H_u \cdot u$ corresponding to the user data and a second component $H_p \cdot p$ corresponding to the parity data such that $H_u \cdot u + H_p \cdot p = 0$; (c) calculating a vector $\underline{u} = H_u \cdot u$; and (d) calculating $p = H_p^{-1} \cdot \underline{u}$.

According to a fifteenth aspect of the present invention, 22, a data transmission system is provided for transmitting user data to and receiving data from a communication channel. A low-density parity-check code encoder encodes the user data u of length $N_u$, by inserting parity data p of length $N_p$ into output data c of length N in accordance with a parity matrix H such that $H \cdot c = 0$. The encoder comprises an input to input the user data of block length $N_u$; an H c decomposer to decompose $H \cdot c$ into a first component $H_u \cdot u$ corresponding to the user data and a second component $H_p \cdot p$ corresponding to the parity data such that $H_u \cdot u + H_p \cdot p = 0$; a $\underline{u}$ calculator to calculate a vector $\underline{u} = H_u \cdot u$; and a $p = \underline{P} \underline{u}$ calculator to calculate $p = H_p^{-1} \cdot \underline{u}$. A transmitter transmits an output of the low-density parity-check code encoder to the communication channel. A soft channel decoder decodes data from the communication channel, and a soft low-density parity-check code decoder decodes data decoded by the soft channel decoder.

According to a sixteenth aspect of the present invention, a low-density parity-check code encoder encodes user data u of length $N_u$, by inserting parity data p of length $N_p$ into output data c of length N in accordance with a parity matrix H such that $H \cdot c = 0$. An input means is provided for inputting the user data of block length $N_u$, and an H c decomposer means decomposes $H \cdot c$ into a first component $H_u \cdot u$ corresponding to the user data and a second component $H_p \cdot p$ corresponding to the parity data such that $H_u \cdot u + H_p \cdot p = 0$. A $\underline{u}$ calculating means for calculating a vector $\underline{u} = H_p \cdot u$, and a $p = \underline{P} \underline{u}$ calculating means for calculating $p = H_u^{-1} \cdot \underline{u}$.

According to a seventeenth aspect of the present invention a second input means is provided for inputting address information, and the $\underline{u}$ calculating means calculates the vector $\underline{u} = H_u \cdot u$ in accordance with the second input means.

According to an eighteenth aspect of the present invention, the $\underline{u}$ calculating means updates elements of $\underline{u}$ as follows: $\underline{u}(i) = \underline{u}(i) \oplus$ bit.

According to a nineteenth aspect of the present invention, the $p = \underline{P} \underline{u}$ calculating means reduces a row weight of $H_u^{-1}$ by representing $H_u^{-1}$ as M1*M2.

According to a twentieth aspect of the present invention, the $p = \underline{P} \underline{u}$ calculating means reduces a row weight of $H_u^{-1}$ representing $H_u^{-1}$ as $$\prod_{i=1}^{s} M_i.$$

According to a twenty-first aspect of the present invention, the $\underline{u}$ calculating means calculates the vector $\underline{u}=H_u \cdot u$ prior to the $p=\underline{P}\ \underline{u}$ calculating means calculating $p=H_p^{-1} \cdot \underline{u}$.

According to a twenty-second aspect of the present invention, a data transmission system is provide for transmitting user data to and receiving data from a communication channel. A low-density parity-check code encoding means encodes user data u of length $N_u$, by inserting parity data p of length $N_p$ into output data c of length N in accordance with a parity matrix H such that $H \cdot c=0$, comprising, and an input means inputs the user data of block length $N_u$. A H c decomposer means is provided for decomposing $H \cdot c$ into a first component $H_u \cdot u$ corresponding to the user data and a second component $H_p \cdot p$ corresponding to the parity data such that $H_u \cdot u + H_p \cdot p = 0$. A $\underline{u}$ calculating means calculates a vector $\underline{u}=H_u \cdot u$, and a $p=\underline{P}\ \underline{u}$ calculating means for calculates $p=H_p^{-1} \cdot \underline{u}$. A transmitting means transmits an output of the low-density parity-check code encoding means to the communication channel. A soft channel decoding means decodes data from the communication channel, and a soft low-density parity-check code decoding means decodes data decoded by the soft channel decoding means.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Figure 1:
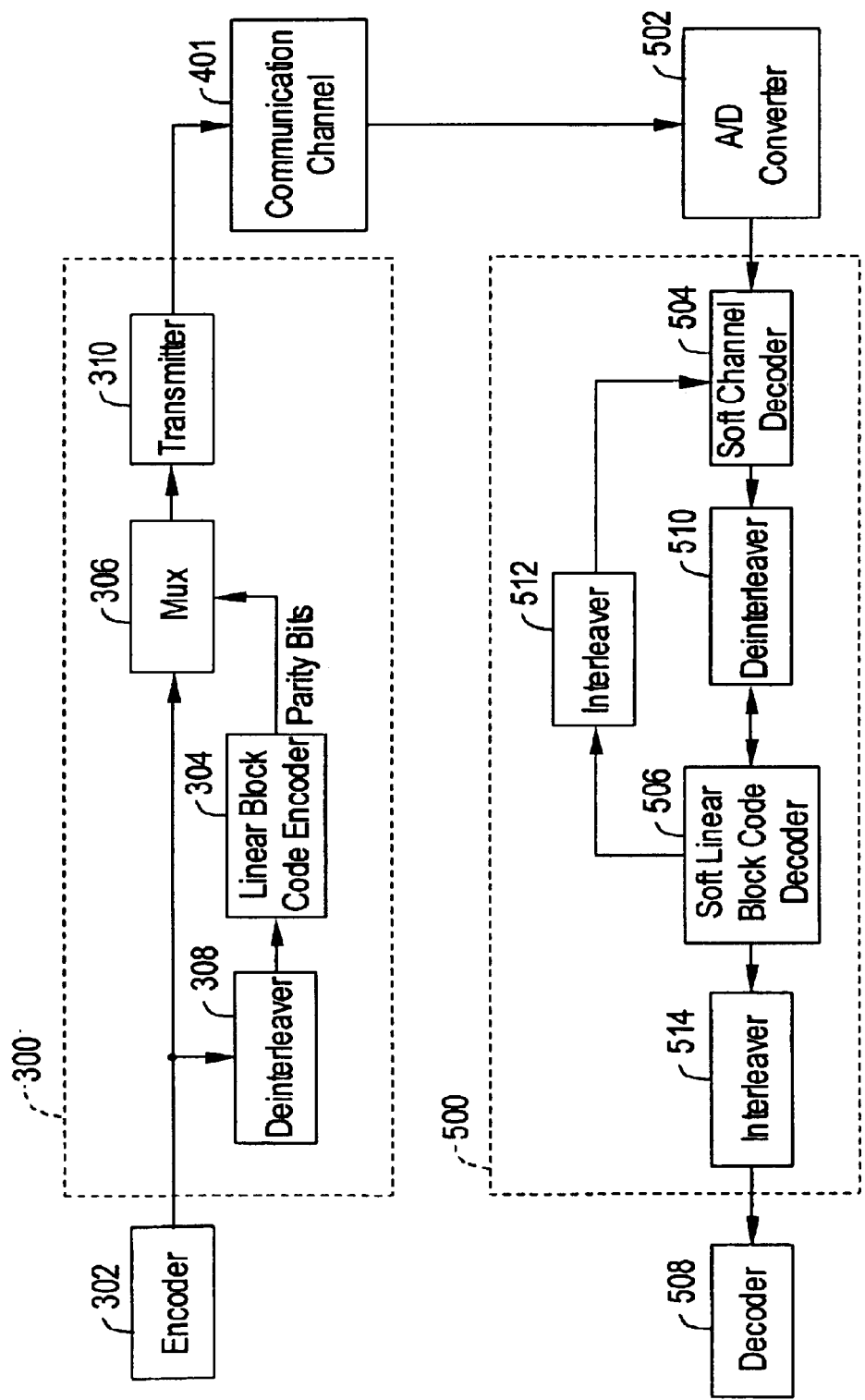
FIG. 1 is a block diagram of a data transmission system.
Figure 2:
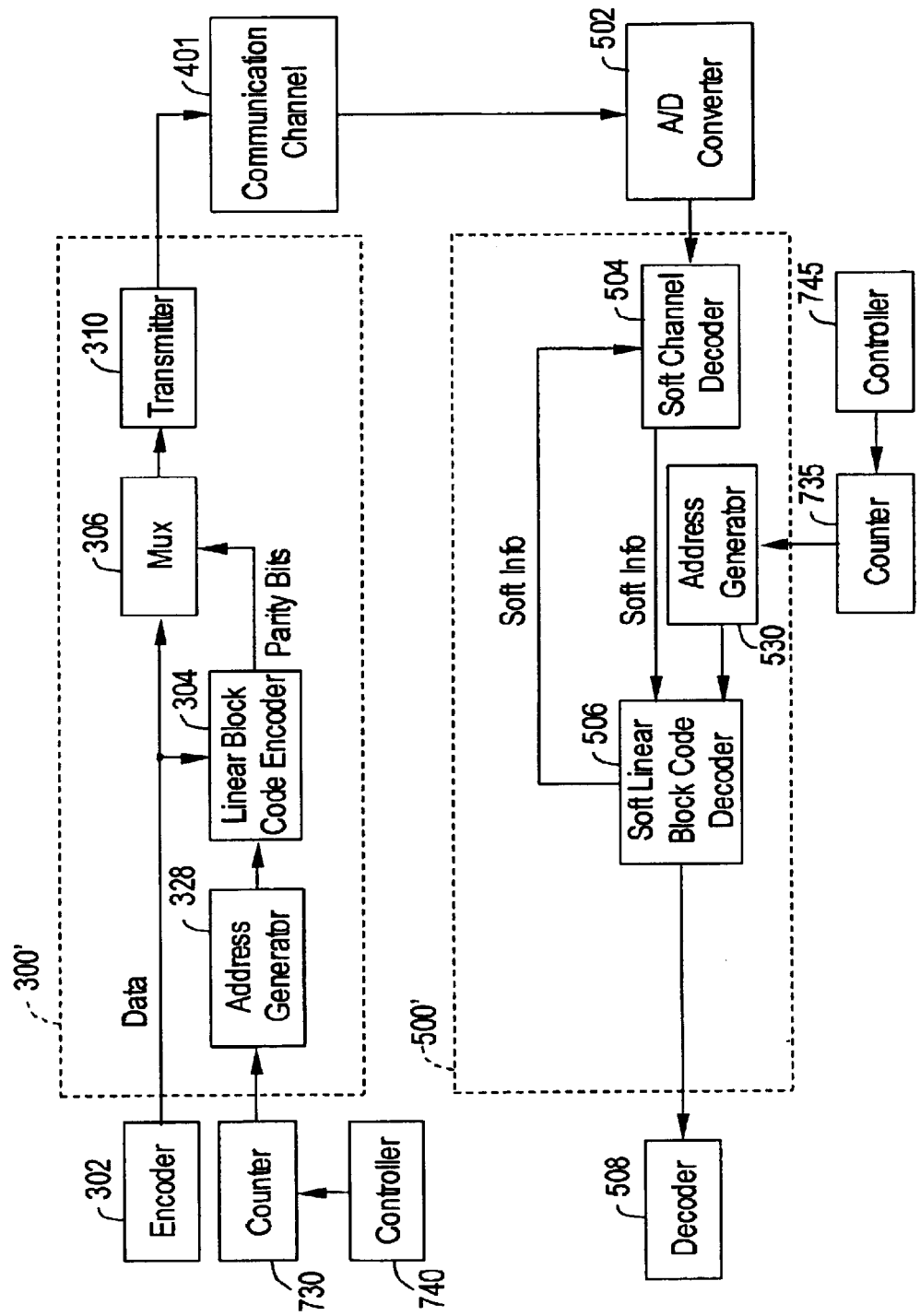
FIG. 2 is a block diagram of another data transmission.
Figure 3:
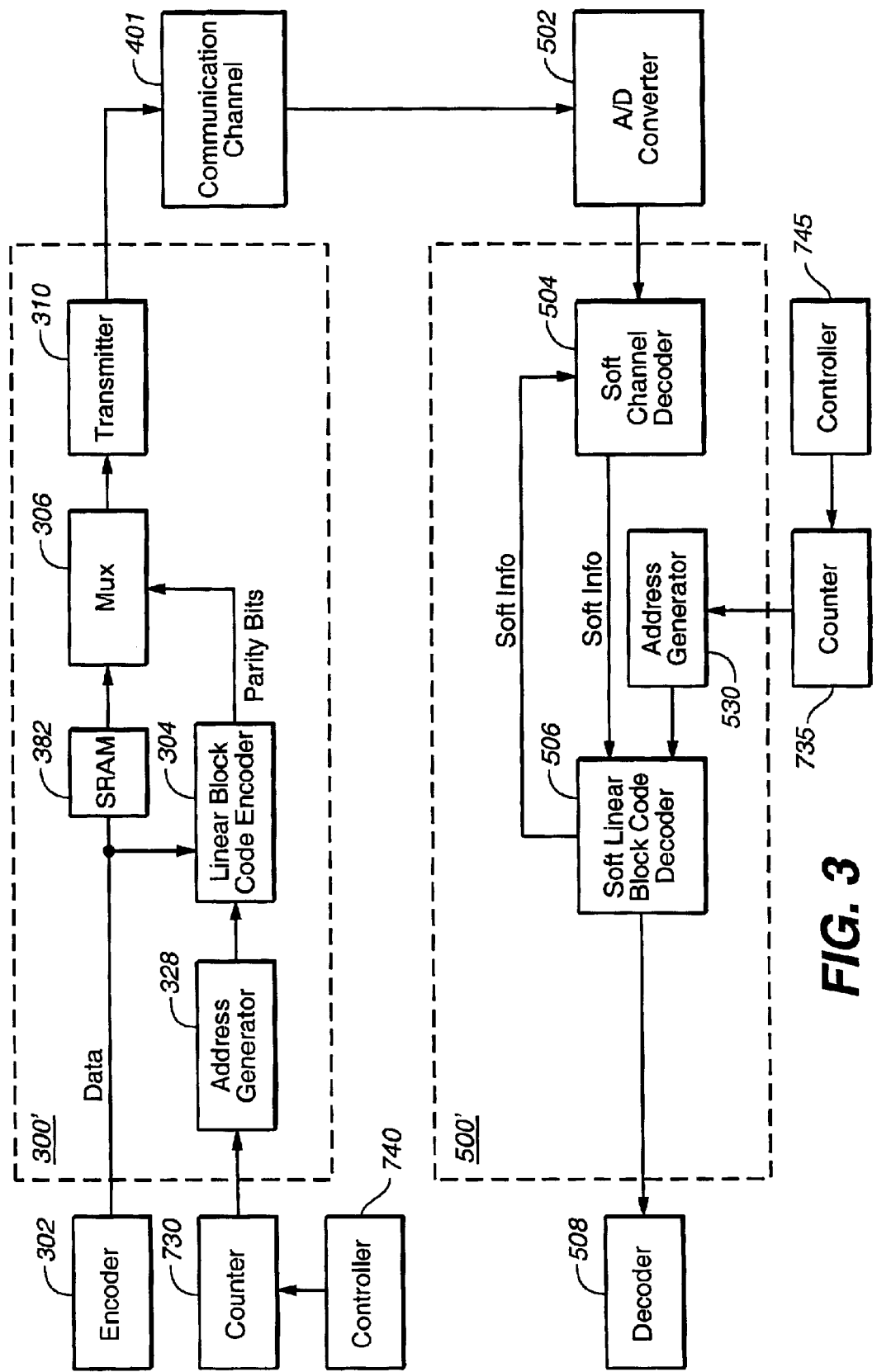
FIG. 3 is a block diagram of a data transmission system in accordance with the present invention.

Reference is now made to FIG. 3, which is a block diagram of a data transmission system in accordance with the present invention. In general as shown therein, a digital data transmission system comprises a transmitting section 300' for transmitting user data to receiver 500' via communication channel 401. The operation of transmission section 300' will now be explained. Prior to processing by transmitting section 300', as in the conventional system, input or user data maybe encoded with an error correcting code, such as the Reed/Solomon code, or run length limited encoded (RLL) or a combination thereof by encoder 302. User data u is temporarily stored in memory 382, preferably implemented as SRAM. Addresses for the parity equations of linear block code encoder 304 are generated by address generator. Address generator 328 is responsive to counter 730 under the control of controller 740. Controller 740 synchronizes counter 730 to the output of encoder 302 so that counter 730 can provide a count of the number of bits in a data block output by encoder 302. In the preferred embodiment the data block size is approximately 5000 bits.

Linear block code encoder 304 utilizes the user data and addresses from address generator 328 to provide the parity bits to multiplexer 306. Linear block code encoder 304 is preferably implemented as a low-density parity-check code (LDPC). The parity data from linear block code encoder 304 is combined with the user data u stored in SRAM 382.

Transmitter 310 transmits the combined user and parity data from multiplexer 306 typically as an analog signal over communication channel 401 in the channel domain. Communication channel 401 may include any wireless, wire, optical, magnetic channel and the like.

Receiver 500' comprises an analog to digital converter 502 to convert the data transmitted on communication channel 401 to a digital signal. The digital signal is input to soft channel decoder 504, which provides soft or probabilistic information of the detected data to soft linear block decoder 506. Soft channel decoder may be implemented as a Soft Viterbi Detector or the like, and address generator 530 may be constructed similarly as address generator 328 in transmission section 300'. The soft information output by soft channel decoder 504 remains in the channel domain and is decoded by soft linear block code decoder 506, in accordance with the address of the parity equations generated by address generator 530. Address generator 530 is responsive to counter 735 under the control of controller 745. Controller 745 synchronizes counter 735 to the output of soft channel decoder 504 so that counter 735 an provide a count of the number of bits in a codeword output by soft channel decoder 504 and a count of the number of codewords.

Soft linear block code decoder 506 operates in combination with soft channel decoder 504 and address generator 530 in an iterative fashion. Soft linear block code decoder is preferably implemented as a low-density parity-check code (LDPC) decoder as described in commonly assigned, copending patent application entitled "LDPC Decoder and Method Thereof", filed on even date and assigned application Ser. No. 09/730,603, the contents of which are incorporated herein by reference.

After the iterative process has completed, the output of soft linear block code decoder 506 is passed on for further processing to decoder 508. Decoder 508 is implemented to perform the reverse operations of encoder 302 or correct for any data errors.

As noted above, the parity data p is inserted into user data u by means of multiplexer 306 to form the codeword c as an N×1 vector. This can be connoted as c=[u,p]. As will be appreciated by one of ordinary skill in the art, the columns of H can be simply rearranged so that the last $N_p$ columns of H correspond to the parity bits. The calculation of the parity bits is equivalent to the solving of a system of linear equations $$H \cdot [u,p]=0 \qquad (3)$$

for the parity vector p. The linear system in equation (3) can be rewritten as:

$$H_u \cdot u + H_p \cdot p = 0 \qquad (4),$$

where $H_u$ is an $N_p \times N_u$ matrix consisting of the first $N_u$ columns of H and $H_p$ is a $N_p \times N_p$ matrix consisting of the parity columns. The H c decomposer 580 performs the rewriting or decomposition of H·c. It is noted that the first term of equation (4), namely $H_u \cdot u$, depends only on the user data and can be precomputed utilizing address generator 328 as explained in detail hereinbelow for storage in preferably flip-flop registers.

Let $\underline{u}$ be a $N_p \times 1$ vector, where $\underline{u} = H_u \cdot u$, and substituting this expression into equation (4) becomes:

$$H_p \cdot p = \underline{u} \quad (5)$$

(Since $\underline{u}$ is a binary vector, $\underline{u} = -\underline{u}$)

Since matrix $H_p$ is of full rank, it is invertible. $\underline{P}$ is defined as $H_p^{-1}$, and the solution to equation (3) is:

$$p = \underline{P} \cdot \underline{u} \quad (6)$$

In view of the above derivation, the encoding procedure can be separated into two steps. First $\underline{u}$ is calculated by $\underline{u}$ calculator 582 from the user bits u utilizing address information from address generator 328, and second the shortened encoding matrix $\underline{P}$ is used to obtain the parity vector p. It is noted that the first step is relatively easy to calculate and the second step still requires a matrix multiplication. However $\underline{P}$ is a $N_p \times N_p$ matrix which is relatively sparse, whereas in the conventional arrangement P is a $N^p \times N_u$ matrix. As will be shown herein below, $\underline{P}$ has an average row weight of approximately 24. This is in contrast to a row weight of approximately 105 for matrix P. It is noted that the complexity of matrix multiplication is determined by a matrix's sparseness, rather than a matrix's dimension. Thus in accordance with the present invention, approximately (105-24) $N_p$ exclusive OR (XOR) operations are saved for each LDPC parity bit.

For example if H is a 3×9 matrix as follows and the underlying interleaver is I(i)=i

| u1 | u2 | u3 | u4 | u5 | u6 | p1 | p2 | p3 |
|---|---|---|---|---|---|---|---|---|
| 1 | 1 | 1 | 0 | 0 | 0 | 1 | 0 | 0 |
| 0 | 0 | 0 | 1 | 1 | 1 | 0 | 1 | 0 |
| 0 | 0 | 1 | 1 | 0 | 0 | 0 | 0 | 1 |

(7)

$H_u$ comprises the first 6 columns of H as follows:

| b1 | b2 | b3 | b4 | b5 | b6 | (8) |
|---|---|---|---|---|---|---|
| 1 | 1 | 1 | 0 | 0 | 0 | |
| 0 | 0 | 0 | 1 | 1 | 1 | |
| 0 | 0 | 1 | 1 | 0 | 0 | |

$H_p$ comprises the last 3 columns of H as follows:

| p1 | p2 | p3 | (9) |
|---|---|---|---|
| 1 | 0 | 0 | |
| 0 | 1 | 0 | |
| 0 | 0 | 1 | |

Suppose the input to encoder 304 is:

$$\begin{matrix} 1 \\ 1 \\ 0 \\ 0 \\ 1 \\ 1 \end{matrix} \quad (10)$$

If $H_u$ is multiplied by u, then $\underline{u} =$ $$\begin{matrix} 0 \\ 0 \\ 0 \end{matrix} \quad (11)$$

Since $H_p$ is an identity matrix, P is also an identity matrix. Therefor $p = \underline{P} \underline{u} = \underline{u} =$ $$\begin{matrix} 0 \\ 0 \\ 0 \end{matrix} \quad (12)$$

The process of calculating $\underline{u}$ is as follows. As data is provided from encoder 302 to linear block encoder 304, the process begins to calculate the parity data in other words, it is not necessary to have the entire codeword to begin calculating the parity data. As the data is provided from encoder 302 to linear block code encoder 304, address generator 328 provides row information indicating the equation utilized b the user data. Commonly assigned, copending application entitled "Address Generator for LDPC Encoder and Decoder and Method Thereof" filed on even date and assigned application Ser. No. 09/730,597, the contents of which are incorporated herein by reference, provides a detailed description generator 328.

For each codeword, vector $\underline{u}$ is initialized to a zero vector, and the components of $\underline{u}$ are updated as follows:

$$\underline{u}(i) = \underline{u}(i) \oplus \text{bit} \quad (13)$$

As will be apparent to one of ordinary skill in the art, if a user bit is 0, then no processing needs to be performed. Additionally, address generator 328 is adjusted for the skipped parity positions.

The following is an example in accordance with the present invention. First for each codeword, vector $\underline{u}$ is initialized a zero vector. As user bits are provided to encoder 304, address generator provides the row information. In this example, matrix $H_u$ is set forth in equation (14) below:

| | u6 | u1 | u4 | u3 | u5 | u2 | (14) |
|---|---|---|---|---|---|---|---|
| Equation 1 | 1 | 1 | 1 | 0 | 0 | 0 | |
| Equation 2 | 0 | 0 | 0 | 1 | 1 | 1 | |
| Equation 3 | 0 | 0 | 1 | 1 | 0 | 0 | | where the user data is input in order of $u_1$, $u_2$, $u_3$, $u_4$, $u_5$ and $u_6$. Hp is as follows:

| p1 | p2 | p3 | (15) |
|---|---|---|---|
| 1 | 0 | 0 | |
| 0 | 1 | 0 | |
| 0 | 0 | 1 | |

$H_u$ and $H_p$ of this example satisfy equations (3) and (4). The equations can be rewritten as:

$$u_6+u_1+u_4+p_1=0,\ u_3+u_5+u_2+p_2=0,\ \text{and}\ u_4+u_3+p_{3=0}, \quad (16)$$

where $\underline{u}_1=u_6+u_1+u_4$; $\underline{u}_2=u_3+u_5+u_2$; and $\underline{u}_3=u_4+u_3$
First, initialize $\underline{u}=$ $$\text{First, initialize } \underline{u} = \begin{matrix} 0 \\ 0 \\ 0 \end{matrix} \quad (17)$$

Next input $u_1$. For $u_1$, address generator 328 outputs r=1. In other words equation 1 of matrix $H_u$ checks the parity of the $u_1$. In this example, $u_1$ is assigned 1 and $$\underline{u} = \begin{matrix} 0+1 \\ 0 \\ 0 \end{matrix} \quad (18)$$
or
$$\underline{u} = \begin{matrix} 1 \\ 0 \\ 0 \end{matrix}$$

As the next bit $u_2$ is input, address processor 328 sets r=2, and for $u_2$=1

$$\underline{u} = \begin{matrix} 1 \\ 0+1 \\ 0 \end{matrix} \quad (19)$$
or
$$\underline{u} = \begin{matrix} 1 \\ 1 \\ 0 \end{matrix}$$

The next bit $u_3$ is input and for $u_3$=0, no update of $\underline{u}$ occurs. (It will be apparent to one of ordinary skill in the art if $u_3$, for $u_3$=0, were to be processed, then $\underline{u}$ would still not change from the previous step, thus resulting in unnecessary processing.)

$$\underline{u} = \begin{matrix} 1 \\ 1 \\ 0 \end{matrix} \quad (20)$$

Similarly for the next bit $u_4$, for $u_4$=0, no update of $\underline{u}$ occurs.

$$\underline{u} = \begin{matrix} 1 \\ 1 \\ 0 \end{matrix} \quad (21)$$

As the next bit $u_5$ is processed, address processor 328 sets r=2, and for $u_5$=1.

$$\underline{u} = \begin{matrix} 1 \\ 1+1 \\ 0 \end{matrix} \quad (22)$$
or
$$\underline{u} = \begin{matrix} 1 \\ 0 \\ 0 \end{matrix}$$

As the next bit $u_6$ is processed, address processor 328 sets r=1, and for $u_6$=1.

$$\underline{u} = \begin{matrix} 1+1 \\ 0 \\ 0 \end{matrix} \quad (23)$$
or
$$\underline{u} = \begin{matrix} 0 \\ 0 \\ 0 \end{matrix}$$

Figure 4:
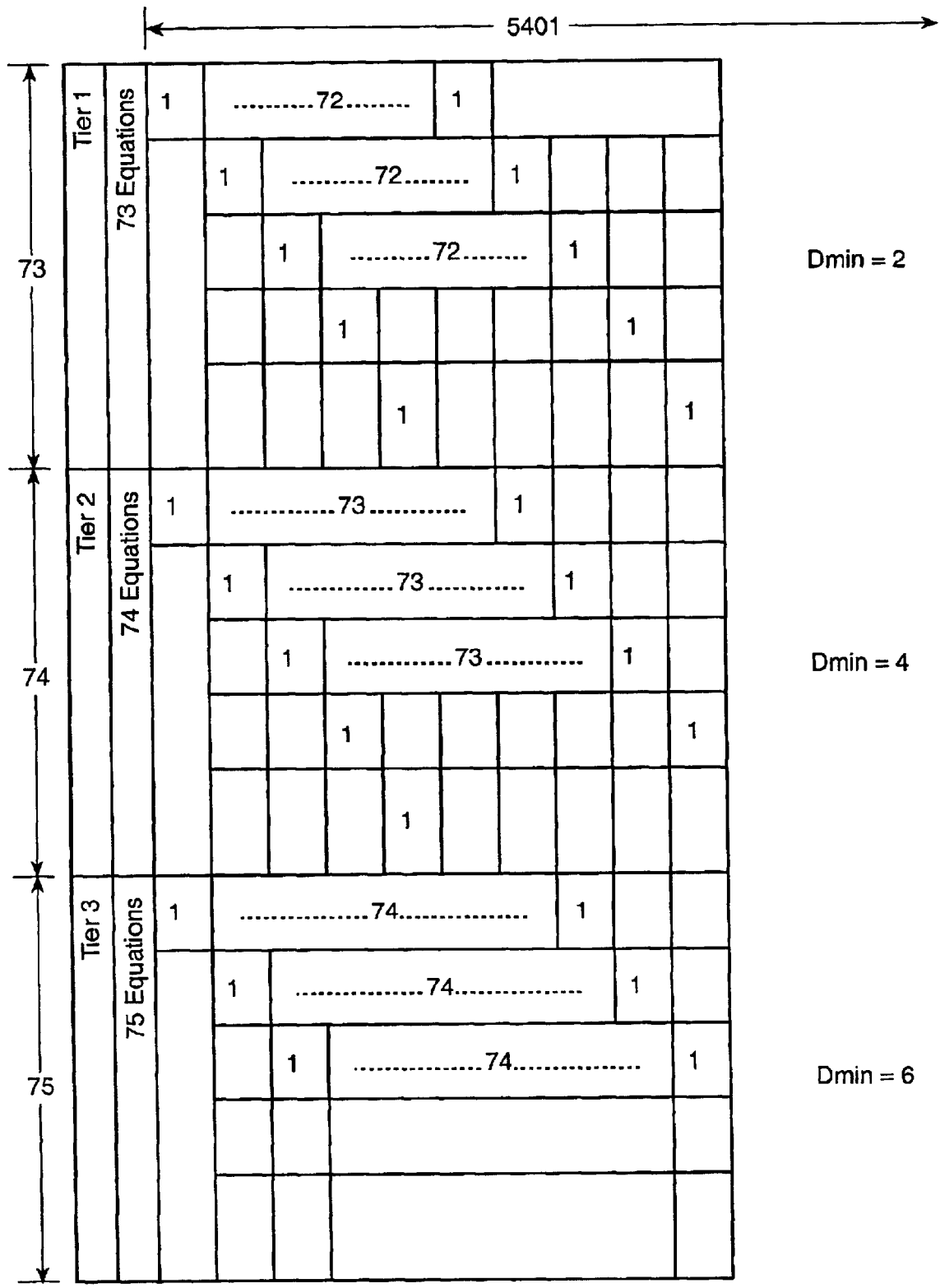
FIG. 4 is an example of a parity check matrix in accordance with the present invention.
Figure 5:
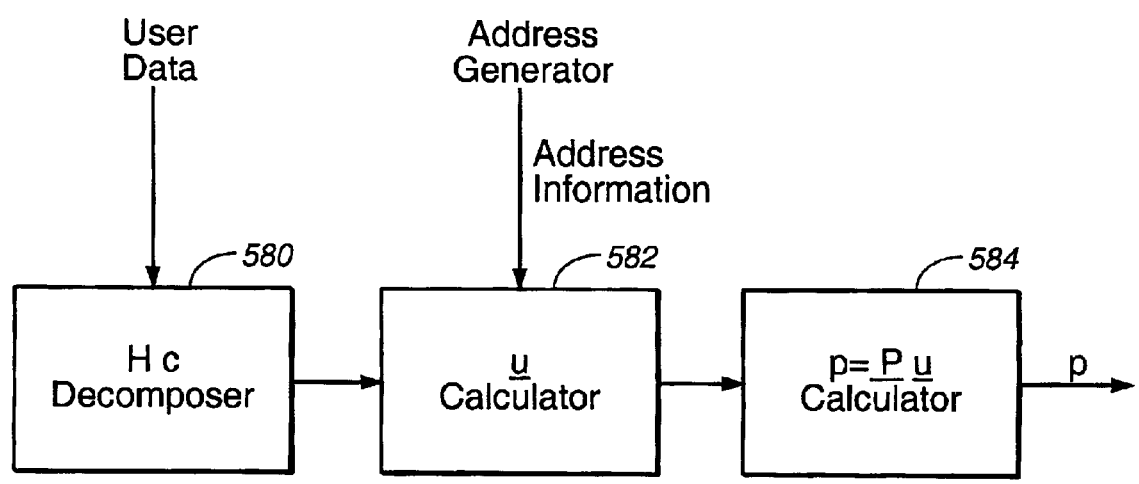
FIG. 5 is a block diagram of a low-density parity-check code encoder in accordance with the present invention.

Once the vector $\underline{u}$ has been computed, some rows are removed because H is not of full rank. In the preferred embodiment, as shown in FIG. 4, the parity check matrix comprises 222 rows (or equations) by 5402 columns, which comprises 220 linearly independent rows (where 5402= 73*74). The matrix can be divided into three tiers of equations having 73, 74 and 75 equations, respectively. As can be seen the tiers (73, 74 and 75) are mutually prime. The set of independent rows can be obtained by removing the last row of the second tier and third tier, namely the $147^{th}$ row and the $222^{nd}$ row. The following table shows the values of the elements in the matrix:

| Tier | $i^{th}$ position | $i^{th}$ position |
|---|---|---|
| 1 | 1 if r = i(mod73) | 0 if r ≠ i(mod73) |
| 2 | 1 if r = i(mod74) | 0 if r ≠ i(mod74) |
| 3 | 1 if r = i(mod75) | 0 if r ≠ i(mod75) | where r is the index within a tier.

where r is the index within a tier.

A matrix having 5402 columns can process a maximum LDPC codeword of 5402 bits. A further discussion on the details of the parity check matrix is provided in "Parity Check Matrix and Method of Forming Thereof", filed on even date and assigned application Ser. No. 09/730,589, the contents of which are incorporated herein by reference.

Utilizing equation (6) the parity vector can be calculated by $\underline{p}=\underline{P}\,\underline{u}$ calculator 584 as follows. As noted above a matrix's sparseness, rather than a matrix's dimension determine the complexity of matrix multiplication. One way to quantify the complexity of the matrix is to determine the average row weight of $\underline{P}$. $\underline{P}$ can be decomposed into two (2) matrices M1 and M2, such that $\underline{P}$=M1*M2. The preferred method of decomposing $\underline{P}$ is by placing the system into echelon form. In the preferred embodiment, M1 and M2 are each 220×220 matrices. The combined row weight of M1 and M2, which is ~24, is lower than that of $\underline{P}$. In general $\underline{P}$ can be represented as $$\prod_{i=1}^{s} M_2$$

in order to reduce the combined row weight. In accordance with the present invention the area of the encoder is about 0.4 mm² (as compared to 0.66 mm² for conventional encoders).

While the invention has been described in conjunction with several specific embodiments, it is evident to those skilled in the art that many further alternatives, modifications and variations will be apparent in light of the foregoing description. More specifically, while the present invention is preferably implemented as an integrated circuit, it is contemplated that the present invention may also be implemented as discrete components or a general-purpose processor operated in accordance with program code instructions or computer program or combination thereof. These program code instructions can be obtain from a medium, such as network, local area network, the Internet, or storage devices. Such storage devices include, by way of example, magnetic storage devices, optical storage devices, electronic storage devices, magneto-optical device and the like. Thus, the invention described herein is intended to embrace all such alternatives, modifications, applications and variations as may fall within the spirit and scope of the appended claims.

What is claimed is:

1. A method to perform low-density parity-check code encoding of user data u of length $N_u$, by inserting parity data p of length $N_p$ into output data c of length N in accordance with a parity matrix H such that H·c=0, comprising the steps of:

(a) receiving the user data of block length $N_u$;
   (b) decomposing H·c into a first component $H_u·u$ corresponding to the user data and a second component $H_p·p$ corresponding to the parity data such that $H_u·u+H_p·p=0$;
   (c) calculating a vector $\underline{u}=H_u·u$; and
   (d) calculating $p=H_p^{-1}·\underline{u}$.

2. The method of claim 1, wherein $H_u$ comprises a $N_p \times N_u$ matrix and $H_p$ comprises a $N_p \times N_p$ matrix.

3. The method of claim 1, further comprising the step of:
   (e) receiving address information,
      wherein step (c) is performed in accordance with step (e).

4. The method of claim 1, wherein step (c) comprises the step of:
   (f) updating elements of $\underline{u}$ as follows:

$u(i)=u(i) \oplus$bit.

5. The method of claim 1, wherein step (d) comprises the step of:
   (g) reducing a row weight of $H_p^{-1}$ by representing $H_p^{-1}$ as M1*M2.

6. The method of claim 1, wherein step (d) comprises the step of:
   (g) reducing a row weight of $H_p^{-1}$ by representing $H_p^{-1}$ as $$\prod_{i=1}^{s} M_i.$$

7. The method of claim 1, wherein step (c) is performed prior to step (d).

8. A low-density parity-check code encoder to encode user data u of length $N_u$, by inserting parity data p of length $N_p$ into output data c of length N in accordance with a parity matrix H such that H·c=0, comprising:

an input to input the user data of block length $N_u$;
   an H c decomposer to decompose H·c into a first component $H_u·u$ corresponding to the user data and a second component $H_p·p$ corresponding to the parity data such that $H_u·u+H_p·p=0$;
   a $\underline{u}$ calculator to calculate a vector $\underline{u}=H_u·u$; and
   a $p=\underline{P}~\underline{u}$ calculator to calculate $p=H_p^{-1}·\underline{u}$.

9. The encoder of claim 8, wherein $H_u$ comprises a $N_p \times N_u$ matrix and $H_p$ comprises a $N_p \times N_p$ matrix.

10. The encoder of claim 8, further comprising:
    a second input to input address information,
       wherein said $\underline{u}$ calculator calculates the vector $\underline{u}=H_u·u$ in accordance with said second input.

11. The encoder of claim 8, wherein said $\underline{u}$ calculator updates elements of $\underline{u}$ as follows:

$u(i)=u(i) \oplus$bit.

12. The encoder of claim 8, wherein said $p=\underline{P}~\underline{u}$ calculator reduces a row weight of $H_p^{-1}$ by representing $H_p^{-1}$ as M1*M2.

13. The encoder of claim 8, wherein said $p=\underline{P}~\underline{u}$ calculator reduces a row weight of $H_p^{-1}$ representing $H_p^{-1}$ as $$\prod_{i=1}^{s} M_i.$$

14. The encoder of claim 8, wherein said $\underline{u}$ calculator calculates the vector $\underline{u}=H_u·u$ prior to said $p=\underline{P}~\underline{u}$ calculator calculating $p=H_p^{-1}·\underline{u}$.

15. A computer program stored on a computer readable medium to perform low-density parity-check code encoding of user data u of length $N_u$, by inserting parity data p of length $N_p$ into output data c of length N in accordance with a parity matrix H such that H·c=0, comprising the steps of:

(a) receiving the user data of block length $N_u$;
   (b) decomposing H·c into a first component $H_u·u$ corresponding to the user data and a second component $H_p·p$ corresponding to the parity data such that $H_u·u+H_p·p=0$;
   (c) calculating a vector $\underline{u}=H_u·u$; and
   (d) calculating $p=H_p^{-1}·\underline{u}$.

16. The computer program of claim 15, wherein $H_u$ comprises a $N_p \times N_u$ matrix and $H_p$ comprises a $N_p \times N_p$ matrix.

17. The computer program of claim 15, further comprising the step of:
    (e) receiving address information,
       wherein step (c) is performed in accordance with step (e).

18. The computer program of claim 15, wherein step (c) comprises the step of:

(g) updating elements of u as follows:

$$u(i)=u(i)\oplus \text{bit}.$$

19. The computer program of claim 15, wherein step (d) comprises the step of:
   (g) reducing a row weight of $H_p^{-1}$ by representing $H_p^{-1}$ as M1*M2.

20. The computer program of claim 15, wherein step (d) comprises the step of:
   (g) reducing a row weight of $H_p^{-1}$ by representing $H_p^{-1}$ as $$\prod_{i=1}^{s} M_i.$$

21. The computer program of claim 15, wherein step (c) is performed prior to step (d).

22. A data transmission system for transmitting user data to and receiving data from a communication channel, comprising:
   a low-density parity-check code encoder to encode user data u of length $N_u$, by inserting parity data p of length $N_p$ into output data c of length N in accordance with a parity matrix H such that H·c=0, comprising:
     an input to input the user data of block length $N_u$;
     an H c decomposer to decompose H·c into a first component $H_u \cdot u$ corresponding to the user data and a second component $H_p \cdot p$ corresponding to the parity data such that $H_u \cdot u + H_p \cdot p = 0$;
     a u calculator to calculate a vector $\underline{u} = H_u \cdot u$; and
     a p=P u calculator to calculate $p = H_p^{-1} \cdot \underline{u}$;
   a transmitter to transmit an output of said low-density parity-check code encoder to the communication channel;
   a soft channel decoder to decode data from the communication channel; and
   a soft low-density parity-check code decoder to decode data decoded by said soft channel decoder.

23. The system of claim 22, wherein $H^u$ comprises a $N^p \times N_u$ matrix and $H_p$ comprises a $N_p \times N_p$ matrix.

24. The system of claim 22, further comprising:
   an address generator to generate address information in accordance with the user data,
   second input means for inputting address information,
   a second input to input address information,
     wherein said u calculator calculates the vector $\underline{u} = H_u \cdot u$ in accordance with said second input.

25. The system of claim 22, wherein said u calculator updates elements of u as follows:

$$u(i)=u(i)\oplus \text{bit}.$$

26. The system of claim 22, wherein said p=P u calculator reduces a row weight of $H_p^{-1}$ by representing $H_p^{-1}$ as M1*M2.

27. The system of claim 22, wherein said p=P u calculator reduces a row weight of $H_p^{-1}$ representing $H_p^{-1}$ as $$\prod_{i=1}^{s} M_i.$$

28. The system of claim 22, wherein said u calculator calculates the vector $\underline{u} = H_u \cdot u$ prior to said p=P u calculator calculating $p = H_p^{-1} \cdot \underline{u}$.

29. A low-density parity-check code encoder to encode user data u of length $N_u$, by inserting parity data p of length $N_p$ into output data c of length N in accordance with a parity matrix H such that H·c=0, comprising:
   input means for inputting the user data of block length $N_u$;
   H c decomposer means for decomposing H·c into a first component $H_u \cdot u$ corresponding to the user data and a second component $H_p \cdot p$ corresponding to the parity data such that $H_u \cdot u + H_p \cdot p = 0$;
   u calculating means for calculating a vector $\underline{u} = H_u \cdot u$; and
   p=P u calculating means for calculating $p = H_p^{-1} \cdot \underline{u}$.

30. The encoder of claim 29, wherein $H_u$ comprises a $N_p \times N_u$ matrix and $H_p$ comprises a $N_p \times N_p$ matrix.

31. The encoder of claim 29, further comprising:
   second input means for inputting address information,
     wherein said u calculating means calculates the vector $\underline{u} = H_u \cdot u$ in accordance with said second input means.

32. The encoder of claim 29, wherein said u calculating means updates elements of u as follows:

$$u(i)=u(i)\oplus \text{bit}.$$

33. The encoder of claim 29, wherein said p=P u calculating means reduces a row weight of $H_u^{-1}$ by representing $H_p^{-1}$ as M1*M2.

34. The encoder of claim 29, wherein said p=P u calculating means reduces a row weight of $H_p^{-1}$ representing $H_p^{-1}$ as $$\prod_{i=1}^{s} M_i.$$

35. The encoder of claim 29, wherein said u calculating means calculates the vector $\underline{u} = H_u \cdot u$ prior to said p=P u calculating means calculating $p = H_p^{-1} \cdot \underline{u}$.

36. A data transmission system for transmitting user data to and receiving data from a communication channel, comprising:
   low-density parity-check code encoding means to encode user data u of length $N_u$, by inserting parity data p of length $N_p$ into output data c of length N in accordance with a parity matrix H such that H·c=0, comprising:
     input means for inputting the user data of block length $N_u$;
     H c decomposer means for decomposing H·c into a first component $H_u \cdot u$ corresponding to the user data and a second component $H_p \cdot p$ corresponding to the parity data such that $H_u \cdot u + H_p \cdot p = 0$;
     u calculating means for calculating a vector $\underline{u} = H_u \cdot u$; and
     p=P u calculating means for calculating $p = H_p^{-1} \cdot \underline{u}$
   transmitting means for transmitting an output of said low-density parity-check code encoding means to the communication channel;
   soft channel decoding means for decoding data from the communication channel; and
   soft low-density parity-check code decoding means for decoding data decoded by said soft channel decoding means.

37. The system of claim 36, wherein $H_u$ comprises a $N_p \times N_u$ matrix and $H_p$ comprises a $N_p \times N_p$ matrix.

38. The system of claim 36, further comprising:
   address generator means for generating address information in accordance with the user data;
   second input means for inputting the address information,
     wherein said u calculating means calculates the vector $\underline{u} = H_u \cdot u$ in accordance with said second input means.

39. The system of claim 36, wherein said u calculating means updates elements of u as follows:

$u(i)=u(i)\oplus bit.$

40. The system of claim 36, wherein said p=P u calculating means reduces a row weight of $H_p^{-1}$ by representing $H_p^{-1}$ as M1*M2.

41. The system of claim 36, wherein said p=P u calculating means reduces a row weight of $H_p^{-1}$ representing $H_p^{-1}$ as $$\prod_{i=1}^{s} M_i.$$

42. The system of claim 36, wherein said u calculating means calculates the vector $\underline{u}=H_u\cdot u$ prior to said p=P u calculating means calculating $p=H_p^{-1}\cdot \underline{u}$.

* * * * *

UNITED STATES PATENT AND TRADEMARK OFFICE
CERTIFICATE OF CORRECTION

PATENT NO. : 7,072,417 B1
APPLICATION NO. : 09/730752
DATED : July 4, 2006
INVENTOR(S) : Gregory Burd et al.

It is certified that error appears in the above-identified patent and that said Letters Patent is hereby corrected as shown below:

Title Page — Insert the following art listed on the Form 1449 submitted May 20, 2005 and Form 892 which were omitted from the patent:

Under "U.S. PATENT DOCUMENTS" insert:

| | | |
|---|---|---|
| 6,721,919 B1 | 04/2004 | Morioka et al. |
| 6,708,308 | 3/2004 | De Souza et al. |
| 6,634,007 | 10/2003 | Koetter et al. |
| 6,691,263 | 02/2004 | Vasic et al. |
| 6,581,181 | 06/2003 | Sonu |
| 6,427,220 | 07/2002 | Vityaev |
| 5,949,831 | 09/1999 | Coker |
| 5,768,294 | 06/1998 | Chen et al. |

Under "OTHER PUBLICATIONS", insert:
J. Hagenauer and P. Hoeher, A Viterbi algorithm with soft-decision outputs and its applications, November 1989, IEEE GLOBECOM '90, pp. 47.1.1-47.1.7

Öberg, Mats, Parity Check Codes for Partial Response Channels, 1999, IEEE Global Telecommunications Conference - Globalcom '99, pp. 717-722.

| | |
|---|---|
| Column 1, Line 41 | Delete "maybe" and insert --may be-- |
| Column 3, Line 40-41 | Delete "$H_u^{-1}$" in both instances and insert --$H_p^{-1}$-- |
| Column 3, Line 43 | Delete "$H_u^{-1}$" and insert --$H_p^{-1}$-- |
| Column 3, Line 44 | Delete "H" and insert --$H_p^{-1}$-- |
| Column 4, Lines 2-3 | Delete "$H_u^{-1}$" in both instances and insert --$H_p^{-1}$-- |
| Column 4, Lines 5-6 | Delete "$H_u^{-1}$" in both instances and insert --$H_p^{-1}$-- |
| Column 4, Lines 63-64 | Delete "$H_u^{-1}$" in both instances and insert --$H_p^{-1}$-- |
| Column 4, Lines 66-67 | Delete "$H_u^{-1}$" in both instances and insert --$H_p^{-1}$-- |
| Column 4, Line 53 | Delete "$H_p$" and insert --$H_u$-- |
| Column 4, Line 54 | Delete "$H_u$" and insert --$H_p$-- |
| Column 5, Line 12 | Delete "provide" and insert --provided-- |
| Column 5, Line 23 | Delete "calculates" and insert --calculating-- |
| Column 5, Line 59 | Delete "maybe" and insert --may be-- |
| Column 6, Line 31 | Delete "an" and insert --can-- |
| Column 7, Line 28 | Delete "$N^P$" and insert --$N_p$-- |
| Column 8, Line 36 | Delete "b" and insert --by-- |
| Column 8, Line 41 | Insert --of address-- after "description" |

UNITED STATES PATENT AND TRADEMARK OFFICE
CERTIFICATE OF CORRECTION

PATENT NO. : 7,072,417 B1
APPLICATION NO. : 09/730752
DATED : July 4, 2006
INVENTOR(S) : Gregory Burd et al.

It is certified that error appears in the above-identified patent and that said Letters Patent is hereby corrected as shown below:

Column 10, Line 53      Delete "09/730,589" and insert --09/730,598--
Column 11, Line 1       Delete "$M_2$" and insert --$M_i$--
Column 11, Line 22      Delete "obtain" and insert --obtained--
Column 11, Line 61      Delete "$H_p$-1" and insert --$H_p^{-1}$--
Column 12, Line 44      Delete "$H_u^{-1}$" and insert --$H_p^{-1}$--
Column 13, Line 42      Delete "$H^u$" and insert --$H_u$--
Column 13, Line 43      Delete "$N^P$" and insert --$N_p$--
Column 14, Line 24      Delete "$H_u^{-1}$" and insert --$H_p^{-1}$--

Signed and Sealed this

Thirteenth Day of March, 2007

JON W. DUDAS
*Director of the United States Patent and Trademark Office*